(12) United States Patent
Forster

(10) Patent No.: US 11,665,823 B2
(45) Date of Patent: May 30, 2023

(54) FUNCTIONAL SUBSTRATES FOR PRINTED ELECTRONIC DEVICES

(71) Applicant: Ian J. Forster, Chelmsford (GB)

(72) Inventor: Ian J. Forster, Chelmsford (GB)

(73) Assignee: Avery Dennison Retail Information Services LLC, Mentor, OH (US)

(*) Notice: Subject to any disclaimer, the term of this patent is extended or adjusted under 35 U.S.C. 154(b) by 0 days.

(21) Appl. No.: 16/875,599

(22) Filed: May 15, 2020

(65) Prior Publication Data

US 2020/0281077 A1    Sep. 3, 2020

Related U.S. Application Data

(62) Division of application No. 15/829,010, filed on Dec. 1, 2017, now Pat. No. 10,660,205.

(Continued)

(51) Int. Cl.
*H05K 1/00* (2006.01)
*H05K 1/18* (2006.01)
(Continued)

(52) U.S. Cl.
CPC ............... *H05K 1/16* (2013.01); *G11C 11/14* (2013.01); *H05K 1/0233* (2013.01); *H05K 1/034* (2013.01);
(Continued)

(58) Field of Classification Search
CPC ............ G11C 11/14; H03H 9/02551; H03H 9/02559; H03H 9/0542; H05K 1/0233; H05K 1/0306; H05K 1/034; H05K 1/05; H05K 1/09; H05K 1/16; H05K 2201/015; H05K 2201/083; H05K 2201/086; H05K 2201/10083; H05K 2201/10265
(Continued)

(56) References Cited

U.S. PATENT DOCUMENTS 6,483,225 B1    11/2002   Spigelmyer
7,105,980 B2    9/2006    Abbott et al.
(Continued)

FOREIGN PATENT DOCUMENTS

DE    102005063283    *  7/2007
EP    0823780         *  11/1998
(Continued)

OTHER PUBLICATIONS

Wang, et al., Theophylline Molecular Imprint Composite Membranes Prepared From poly(vinylidene fluoride) (PVDF) substrate, May 15, 2010, http://www.sciencedirect.com/science/article/pii/S0009250910000977.
(Continued)

*Primary Examiner* — Andargie M Aychillhum

(57) ABSTRACT

A circuit device formed from a functional substrate. The circuit device comprises a functional substrate component and printed electronic elements formed on the functional substrate component. The printed electronic elements formed on the functional substrate component interact with the substrate component to perform a function and to modify the functional substrate component. The circuit device typically needs a passive base material that takes no functional part in the device operation except mechanical support.

5 Claims, 4 Drawing Sheets

Related U.S. Application Data

(60) Provisional application No. 62/428,878, filed on Dec. 1, 2016.

(51) Int. Cl.
*H05K 7/00* (2006.01)
*H05K 1/16* (2006.01)
*H05K 1/09* (2006.01)
*H05K 1/02* (2006.01)
*H05K 1/05* (2006.01)
*H05K 1/03* (2006.01)
*G11C 11/14* (2006.01)
*H03H 9/02* (2006.01)
*H03H 9/05* (2006.01)

(52) U.S. Cl.
CPC ............ *H05K 1/0306* (2013.01); *H05K 1/05* (2013.01); *H05K 1/09* (2013.01); *H03H 9/02551* (2013.01); *H03H 9/02559* (2013.01); *H03H 9/0542* (2013.01); *H05K 2201/015* (2013.01); *H05K 2201/083* (2013.01); *H05K 2201/086* (2013.01); *H05K 2201/10083* (2013.01); *H05K 2201/10265* (2013.01)

(58) Field of Classification Search
USPC .......................................................... 361/748
See application file for complete search history.

(56) References Cited

U.S. PATENT DOCUMENTS

| | | |
|---|---|---|
| 7,152,804 B1 | 12/2006 | MacKenzie et al. |
| 7,230,512 B1 | 6/2007 | Carpenter et al. |
| 7,309,392 B2 | 12/2007 | Kajigaya et al. |
| 7,683,323 B2 | 3/2010 | Kymissis |
| 7,754,137 B2 | 7/2010 | Sutcliffe et al. |
| 8,011,074 B2 | 9/2011 | Bhattacharjee et al. |
| 8,288,776 B2 | 10/2012 | Choi et al. |
| 8,425,875 B2 | 4/2013 | Kajiyama et al. |
| 8,956,809 B2 | 2/2015 | Grimbergen |
| 8,957,484 B2 | 2/2015 | Melville et al. |
| 9,099,634 B2 | 8/2015 | Inoue et al. |
| 2003/0169575 A1 | 9/2003 | Ikuta et al. |
| 2004/0077124 A1 | 4/2004 | Ogawa |
| 2006/0172082 A1 | 8/2006 | Masuda |
| 2006/0186755 A1* | 8/2006 | Mori ................. H03H 9/0542 310/313 R |
| 2006/0283247 A1* | 12/2006 | Liu ................. G01P 15/0975 73/514.01 |
| 2007/0120623 A1 | 5/2007 | Sakiyama et al. |
| 2010/0269319 A1 | 10/2010 | Omura et al. |
| 2010/0328328 A1 | 12/2010 | Choi et al. |
| 2011/0048611 A1 | 3/2011 | Carre et al. |
| 2012/0198672 A1 | 8/2012 | Ueda |
| 2013/0049542 A1 | 2/2013 | Otsuki |
| 2013/0169383 A1 | 7/2013 | Adkisson et al. |
| 2015/0325228 A1 | 11/2015 | Choi et al. |
| 2018/0248535 A1 | 8/2018 | Koreeda |
| 2018/0287588 A1 | 10/2018 | Takeshita |
| 2018/0294797 A1 | 10/2018 | Ozasa |

FOREIGN PATENT DOCUMENTS

| | | |
|---|---|---|
| JP | 07-147035 | 6/1995 |
| JP | 2000-113152 | 4/2000 |
| JP | 2002290182 | 10/2002 |

OTHER PUBLICATIONS

Shimizu, Yasutaka. Current Status of Piezoelectric Substrate and Propagination Characteristics for SAW Devices, 1993 https://iopscience.iop.org/article/10.1143/JJAP.32.2183/pdf.

Kadota, Michio, Surface Acoustic Wave Characteristics of a ZnO/Quartz Substrate Structure Having a Large Electromechanical Coupling Factor and a Small Temperature Coefficient, 1997, https://iopscience.iop.org/article/10.1143/JJAP.36.3076/meta.

International Preliminary Report on Patentability dated Jun. 13, 2019 issued in corresponding IA No. PCT/US2017/064184 filed Dec. 1, 2017.

"Sensors and text techniques," Edited by Na Yang, Aviation Industry Press, Beijing, Jul. 2012, 5 pages.

* cited by examiner

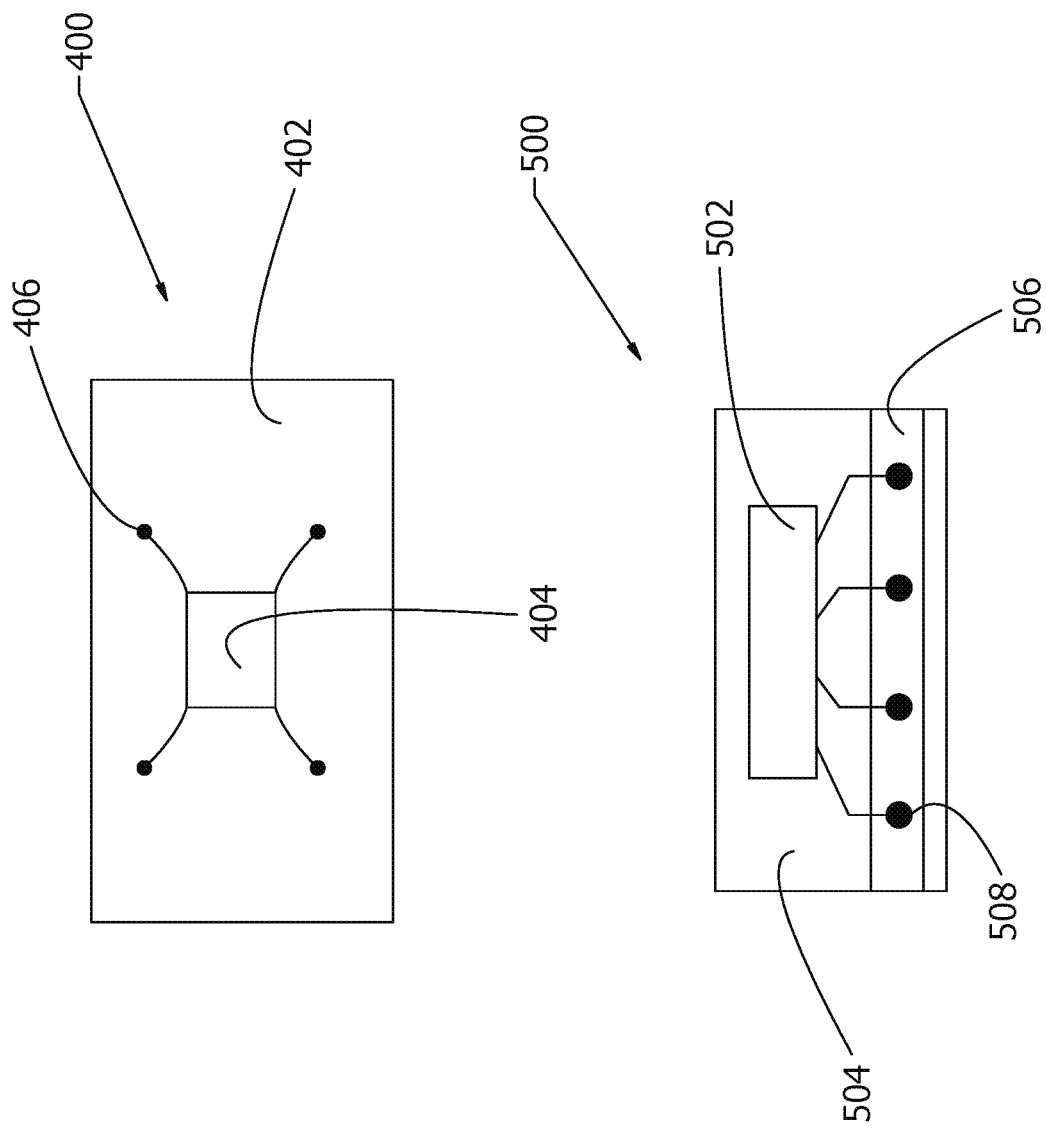

FUNCTIONAL SUBSTRATES FOR PRINTED ELECTRONIC DEVICES

CROSS REFERENCE TO RELATED APPLICATIONS

The present application is a division of U.S. patent application Ser. No. 15/829,010 filed Dec. 1, 2017, which claims priority to U.S. Provisional Patent Application No. 62/428,878 filed Dec. 1, 2016, both of which are incorporated herein by reference in their entireties.

BACKGROUND

The present invention relates generally to a circuit device formed from a functional substrate component. Specifically, the substrate exhibits properties designed to interact with the printed electronics to perform a function beyond mechanical support.

Printed or vacuum formed electronics are increasingly finding uses in a great variety of applications, including portable electronics, signage, lighting, product identification, packaging flexible electronic devices (such as those that can be rolled or bent), photovoltaic devices, medical and diagnostic devices, antennas (including RFID antennas), displays, sensors, thin-film batteries, electrodes, etc. Printed electronics have a variety of advantages over electronics made using other methods, including their use in flexible devices, such as displays, that are designed to be rolled, twisted, or bent.

Typically, printed or vacuum formed electronic devices are formed on a substrate to support them during processing. The substrate is typically comprised of materials such as glass or metals. These materials are passive, in that they take no functional part in the device operation except mechanical support. However, sometimes it is necessary or at least desired for the substrate, or an initial layer formed on it, to be functional, in that the substrate exhibits properties designed to interact with the electronics to perform a function beyond mechanical support.

Accordingly, the present invention discloses a circuit device formed from a functional substrate component. The printed electronic elements formed on the functional substrate component interact with the substrate component to perform a function and to modify the functional substrate component.

SUMMARY

The following presents a simplified summary in order to provide a basic understanding of some aspects of the disclosed innovation. This summary is not an extensive overview, and it is not intended to identify key/critical elements or to delineate the scope thereof. Its sole purpose is to present some concepts in a simplified form as a prelude to the more detailed description that is presented later.

The subject matter disclosed and claimed herein, in one aspect thereof, comprises a circuit device formed from a functional substrate. The circuit device comprises a functional substrate component and printed electronic elements formed on the functional substrate component. The printed electronic elements formed on the functional substrate component interact with the substrate component to perform a function and to modify the functional substrate component. The circuit device typically needs a base material, such as glass, stainless steel, or plastics. The base material may or may not be removed once the circuit device has been constructed. The base material would be passive, in that it takes no functional part in the device operation except mechanical support.

In another embodiment, the circuit device comprises a surface acoustic wave (SAW) device which is designed to act as a frequency stabilizing element in an oscillator, in conjunction with an amplifier. The oscillator is controlled by a logic circuit component formed on the substrate component. The logic circuit component activates and modulates the oscillator in conjunction with an antenna to transmit or receive information.

In another embodiment, the circuit device comprises a functional substrate component comprising magnetic material. The electronic components comprise coils that exhibit magneto resistance and that interact with magnetic areas in the substrate component. The circuit device then acts as a form of storage of information, such as digital bits. The magnetic material of the substrate component can also function as a magnetic strip. This interaction allows the magnetic strip to be modified by the circuit as well as the state to be read.

To the accomplishment of the foregoing and related ends, certain illustrative aspects of the disclosed innovation are described herein in connection with the following description and the annexed drawings. These aspects are indicative, however, of but a few of the various ways in which the principles disclosed herein can be employed and is intended to include all such aspects and their equivalents. Other advantages and novel features will become apparent from the following detailed description when considered in conjunction with the drawings.

BRIEF DESCRIPTION OF THE DRAWINGS

FIG. 4A illustrates a top perspective view of the circuit device wherein the substrate comprises a magnetic material in accordance with the disclosed architecture.

FIG. 4B illustrates a top perspective view of the circuit device wherein the substrate comprises a magnetic material and functions as a magnetic strip in accordance with the disclosed architecture.

DETAILED DESCRIPTION

Figure 1:
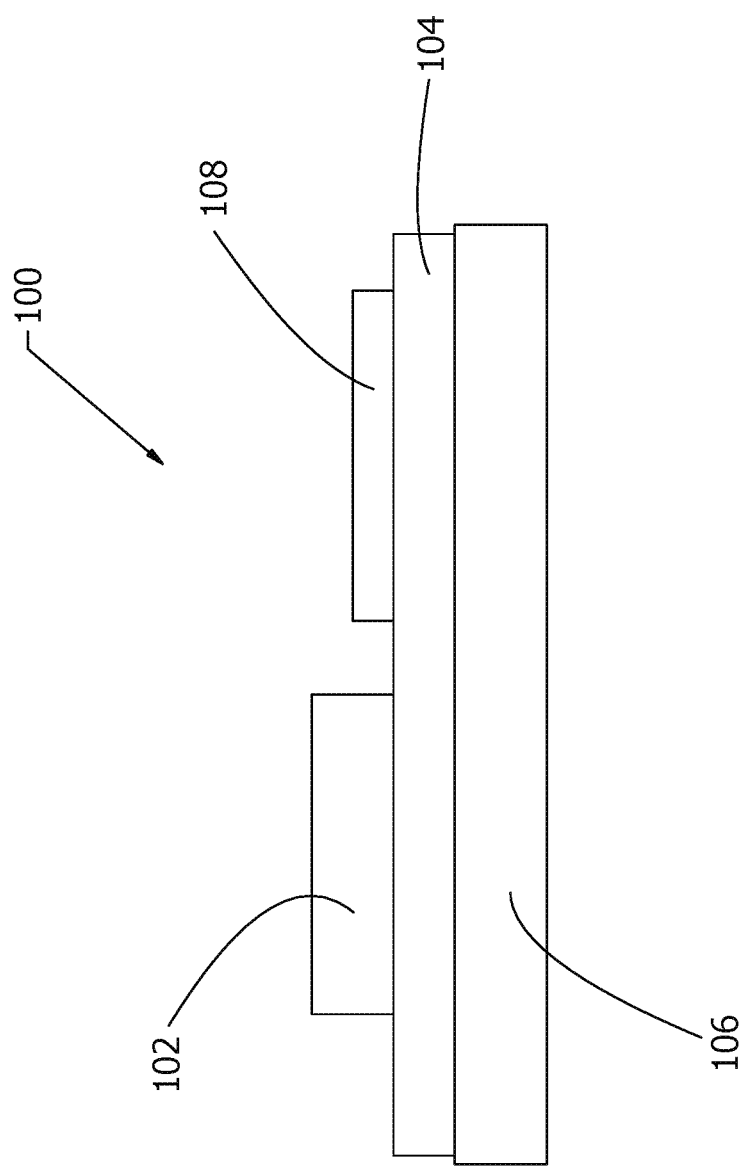
FIG. 1 illustrates a side perspective view of the circuit device with printed electronic elements in accordance with the disclosed architecture.

The innovation is now described with reference to the drawings, wherein like reference numerals are used to refer to like elements throughout. In the following description, for purposes of explanation, numerous specific details are set forth in order to provide a thorough understanding thereof. It may be evident, however, that the innovation can be practiced without these specific details. In other instances, well-known structures and devices are shown in block diagram form in order to facilitate a description thereof.

A circuit device is disclosed that is formed from a functional substrate in that it has properties designed to interact with the electronics to perform a function beyond mechanical support. The circuit device comprises a functional substrate component and printed electronic elements formed on the functional substrate component. The printed electronic elements formed on the functional substrate component interact with the substrate component to perform a function and to modify the functional substrate component.

Besides the well-known methods of creating circuit blocks, the circuit devices 100 can be used in a number of alternative methods, as well. For example, transistors, diodes, and memory cells on a silicon wafer have been experimented with and functional devices, such as display drivers and low frequency RFID devices have been created. Materials used in these devices 100 include organic semiconductors, such as those based on polyanilines, amorphous silicon, and metal oxides.

Referring initially to the drawings, FIG. 1 illustrates a circuit device 100 with printed electronic elements 102 formed on the functional substrate component 104. Specifically, the circuit device 100 can be any suitable size, shape, and configuration as is known in the art without affecting the overall concept of the invention. One of ordinary skill in the art will appreciate that the shape and size of the circuit device 100 as shown in FIG. 1 is for illustrative purposes only and many other shapes and sizes of the circuit device 100 are well within the scope of the present disclosure. Further, although dimensions of the circuit device 100 (i.e., length, width, and height) are important design parameters for good performance, the circuit device 100 may be any shape or size that ensures optimal performance and sensitivity during use.

Typically, the functional substrate component 104 comprises piezoelectric, magnetic, or dielectric properties which interact with the printed electronic elements 102 to perform a function. The functional substrate component 104 is modified 108 by one or more of the steps used in fabricating the electronic elements 102 to allow interaction. The electronic elements 102 are commonly referred to as 'printed', although other methods such as vacuum deposition, etching, or any other suitable methods as is known in the art, can be used to create electronic circuits on a functional substrate 104. Printed electronics 102 are typically made by printing the electronic circuit or other component or device on a substrate using an electrically conductive metal-based ink.

Generally, the circuit devices 100 require a base material 106 for them to be built on, such as glass, stainless steel, or plastics such as polyimides, polyethylene terephalate, or any other suitable base material as is known in the art. This base material 106 may or may not be removed once the circuit device 100 construction has been completed. However, this base material 106 would be described as passive as it takes no functional part in the circuit device 100 operation except mechanical support.

Figure 2:
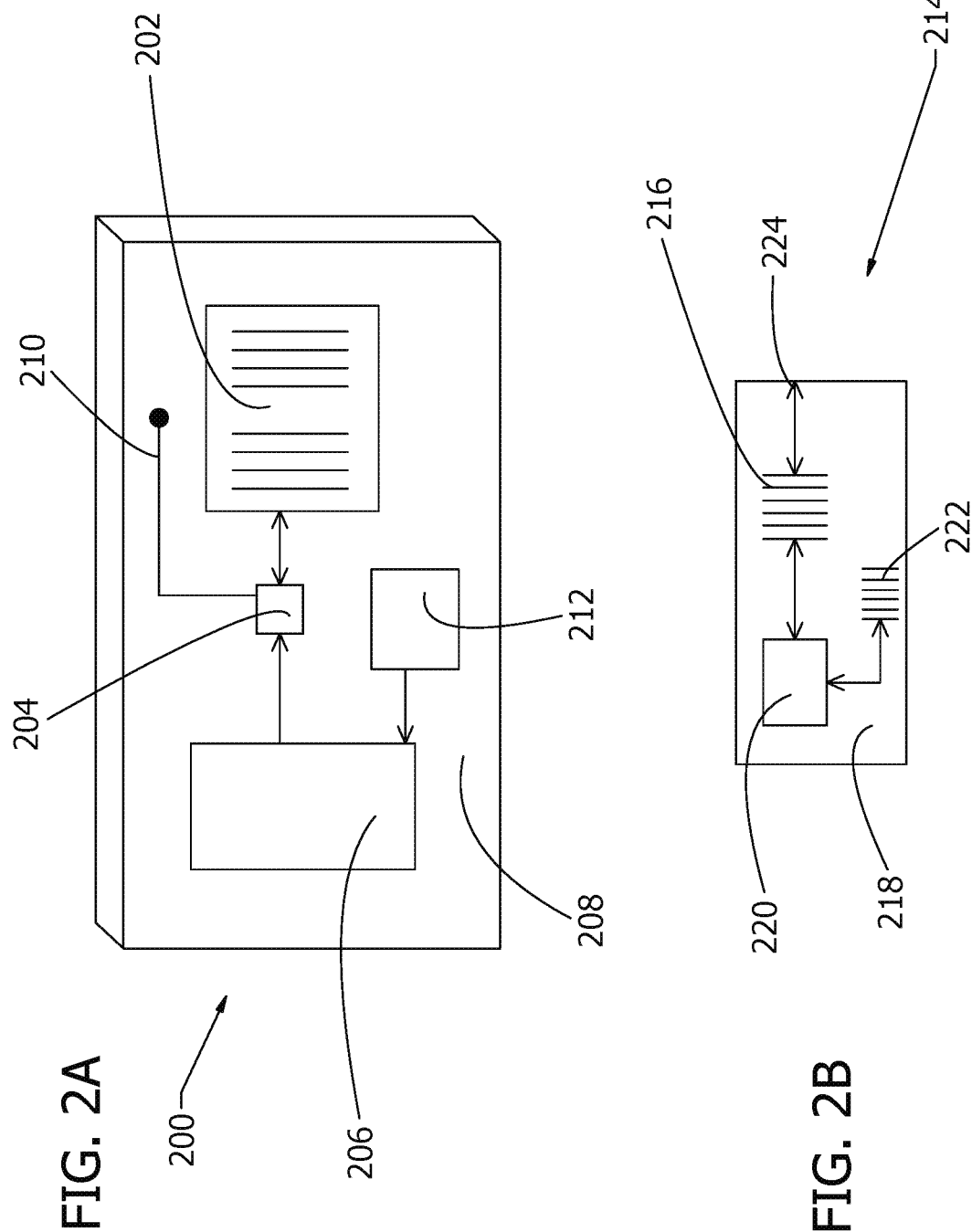
FIG. 2A illustrates a top perspective view of the circuit device with a surface acoustic wave device in accordance with the disclosed architecture.
FIG. 2B illustrates a top perspective view of the circuit device which includes both receive and transmit functions in accordance with the disclosed architecture.

One exemplary embodiment of how a functional substrate 104 can be combined with an electronic circuit component 102 formed on the surface of the substrate 104 to create the circuit device 100 is shown in the transmitter 200 of FIG. 2A, wherein a Surface Acoustic Wave (SAW) device 202 is designed to act as the frequency stabilizing element in an oscillator. A SAW device 202 is a well-known device that is functional at high frequencies, based on the propagation of acoustic waves in the surface of a suitable substrate 208, such as quartz or lithium niobate. The SAW device 202 can also perform functions such as frequency control, filtering and sensing. These SAW devices 202 are used extensively in items such as cellular phones. The SAW devices 202 are also commonly formed by a deposition of a metal, such as aluminum, onto the substrate and formation of a defined pattern in that layer.

In this embodiment, the SAW device 202 is designed to act as the frequency stabilizing element in an oscillator, in conjunction with an amplifier 204, such as one or more transistors (or other suitable device as is known in the art) operating in the required frequency. The oscillator is controlled by a logic circuit 206 built onto the quartz or lithium niobate substrate 208. This circuit 206 can activate the oscillator but also modulate it, so that, in conjunction with an antenna 210 formed either on the substrate 208 or external to the substrate 208, the device can transmit information, such as codes stored inside the logic or data derived from a sensor. Power for the circuit can either be derived by energy harvesting, or optionally using the piezoelectric properties of the base, from a battery 212, either on the substrate 208 or externally.

FIG. 2B shows an alternative embodiment of a transmitter/receiver device 214. The alternative transmitter/receiver device 214 incorporates both receiving and transmitting functions, as well as, optionally, a filter 216. This transmitter/receiver device 214 can be used to establish bidirectional communications with other systems. For example, the transmitter/receiver device 214 can act as a Bluetooth transceiver, an access point for a WiFi system, or, in a preferred embodiment, an RFID reader.

The functional substrate component 218 of this embodiment is typically manufactured of quartz, lithium niobate, or other suitable substrate materials as is known in the art. Logic and/or RF electronics 220 are positioned on the substrate component 218 to interact with the SAW resonator 222 for frequency control. The SAW filter 216 in conjunction with an antenna 224 formed either on the substrate 218 or external to the substrate 218 allows the device to transmit and receive information, such as codes stored inside the logic or data derived from a sensor, as well as establish bidirectional communications with other systems.

Figure 3:
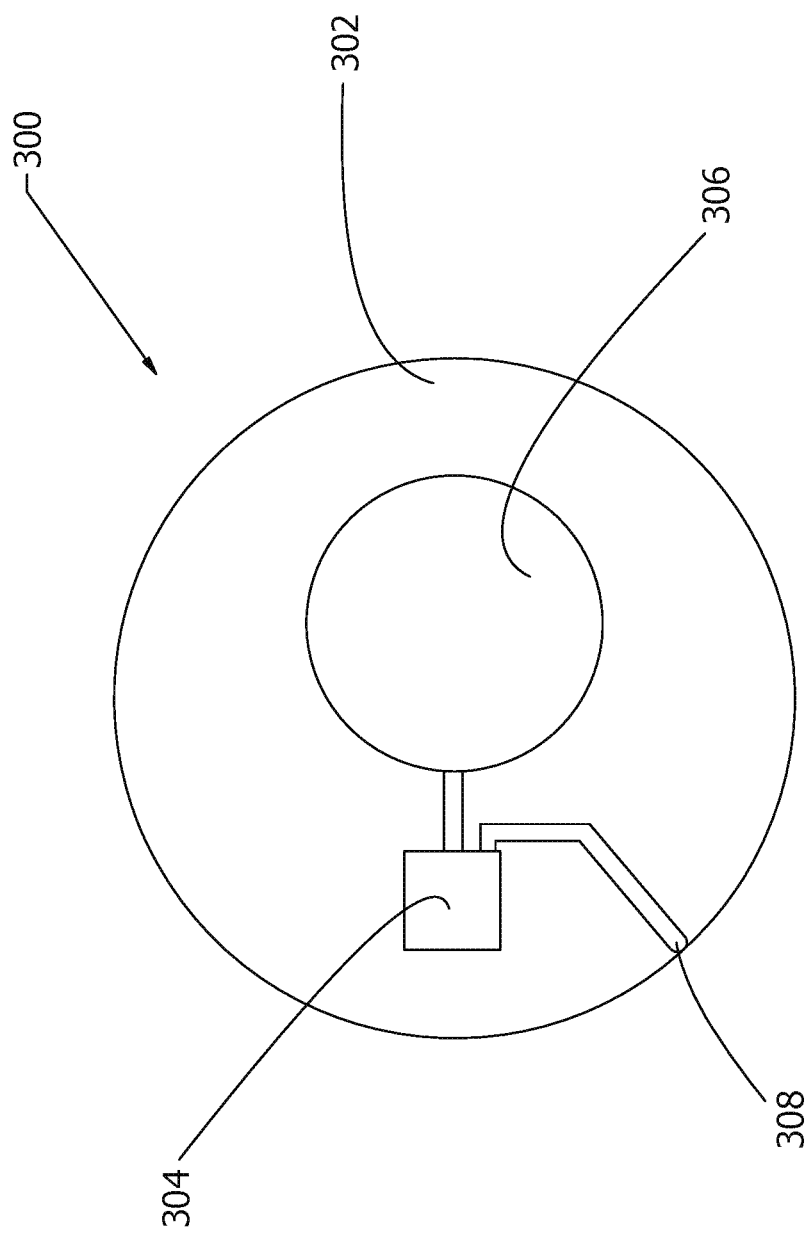
FIG. 3 illustrates a top perspective view of the circuit device where the electronics formed on the surface can cause the device to emit sonic and/or ultrasonic signals in accordance with the disclosed architecture.

FIG. 3 illustrates an alternative structure of an acoustic sounder device 300 wherein the functional substrate 302 is a piezoelectric plastic film or ceramic. The electronics 304 formed on the surface can cause the device 300 to emit sonic and/or ultrasonic signals, and may also receive them as required. Typical applications would be the emission of sounds associated with promotional activities, greeting cards, etc.

The substrate 302 is typically a piezoelectric plastic film, such as PVDF, wherein drive electronics 304 are formed on the surface. The drive electronics 304 interact with a top conductor 306 as well as a base conductor 308 to cause the device 300 to emit and/or receive sonic and/or ultrasonic signals.

FIG. 4A illustrates an alternative structure 400 wherein the substrate 402 is a magnetic material, such as an iron oxide, steel or materials based on other magnetic metals when in their oxide state. Then, electronic components 404 such as coils or other devices exhibiting magneto resistance can interact with the magnetic areas in the substrate 402 as well as the read/write points 406, which then acts as a form of storage of information. This device may then store digital bits, which are used to control the actions of the electronic circuit 404, and data, such as identifying information for an RFID chip.

Further, as the magnetic storage is not inherently binary, analogue values may be stored, which, when sequentially addressed, can be samples of an analogue waveform such as speech or music, which can be played out to a speaker; such analogue values can also playback device to be realized.

In an alternative structure 500, FIG. 4B shows active electronic components 502 formed on a magnetic substrate 504, where the magnetic material of the substrate 504 functions as a magnetic strip 506. Specifically, read/write points 508 from the electronic circuit 502 interact with the magnetic strip 506. This interaction allows the magnetic strip 506 to be modified by the electronic circuit 502 as well as the state to be read. This interaction may be used in an RFID device designed to be interoperable between both magnetic strip type read/write devices and RFID read/write devices.

In the cases where a magnetic material is used as a base substrate, the high permeability can be used to increase the inductance of coils formed on the surface, allowing them to resonate with a capacitor at lower frequencies than would otherwise be possible.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A circuit device, comprising:
   a functional substrate component;
   printed electronic elements including a logic circuit and an antenna both formed on the functional substrate component, wherein the logic circuit controls an oscillator built on the functional substrate component, wherein the functional substrate component is configured to be modified so that the functional substrate component performs a function other than mechanical support; and
   a surface acoustic wave (SAW) device formed by deposition of a metal on the functional substrate component, wherein the logic circuit disposed on the functional substrate component interacts with the SAW device to modulate the SAW device, in a manner so that the SAW device in conjunction with the antenna formed on the functional substrate component or external to the functional substrate component transmits information stored in the logic circuit.

2. The circuit device of claim 1, wherein the functional substrate component comprises quartz or lithium niobate.

3. The circuit device of claim 1, logic circuit formed on the functional substrate component activates and modulates the oscillator.

4. The circuit device of claim 1, wherein the antenna is in communication with the logic circuit and the oscillator to transmit information.

5. The circuit device of claim 1, wherein the SAW device includes a SAW resonator for frequency control and a SAW filter which are in communication with the logic circuit and the oscillator to receive and transmit information.

* * * * *